(12) United States Patent
Chen

(10) Patent No.: US 11,257,988 B2
(45) Date of Patent: Feb. 22, 2022

(54) LED HOLDER, LED MODULE AND METHOD FOR MANUFACTURING LED HOLDER

(71) Applicant: KAISTAR Lighting (Xiamen) Co., Ltd.

(72) Inventor: Jing Chen, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 102 days.

(21) Appl. No.: 16/262,870

(22) Filed: Jan. 30, 2019

(65) Prior Publication Data

US 2019/0245125 A1    Aug. 8, 2019

(30) Foreign Application Priority Data

Feb. 8, 2018    (CN) .......................... 201810127199.2

(51) Int. Cl.
*H01L 33/48*    (2010.01)
*H01L 33/60*    (2010.01)
(Continued)

(52) U.S. Cl.
CPC ...... *H01L 33/486* (2013.01); *H01L 23/49551* (2013.01); *H01L 23/49861* (2013.01);
(Continued)

(58) Field of Classification Search
CPC ...... H01L 23/495–23/49596; H01L 23/49861; H01L 21/4821–4842; H01L 33/483; H01L 33/486
See application file for complete search history.

(56) References Cited

U.S. PATENT DOCUMENTS 9,249,957 B2 * 2/2016 Yoon ................. F21V 21/00
9,705,041 B2 * 7/2017 Im .................... H01L 33/382
(Continued)

FOREIGN PATENT DOCUMENTS

CN       102769088 A    11/2012
CN       104282821 A     1/2015
JP       2003152228 A    5/2003

OTHER PUBLICATIONS

Machine translation of JP2003-152228 A, Nakagawa et al. (Year: 2003).*

*Primary Examiner* — Scott B Geyer
(74) *Attorney, Agent, or Firm* — Hemisphere Law, PLLC; Zhigang Ma

(57) ABSTRACT

The application relates to an LED module, an LED holder, and a method for manufacturing the LED holder. The LED holder includes an insulating carrier and a lead frame. The insulating carrier includes a first sidewall, a second sidewall opposite to the first sidewall, and a partition portion positioned between the first sidewall and the second sidewall. The lead frame includes a first electrode and a second electrode positioned at two sides of the partition portion respectively. The first electrode includes a first bottom portion and a first wing portion obliquely connected with the first bottom portion. The second electrode includes a second bottom portion and a second wing portion obliquely connected with the second bottom portion. The LED holder can improve the reflectivity of the insulating carrier and can prevent the insulating carrier from aging.

15 Claims, 9 Drawing Sheets

(51) Int. Cl.
    *H01L 33/62*     (2010.01)
    *H01L 23/495*     (2006.01)
    *H01L 23/498*     (2006.01)

(52) U.S. Cl.
    CPC .............. *H01L 33/60* (2013.01); *H01L 33/62* (2013.01); *H01L 2933/0033* (2013.01); *H01L 2933/0066* (2013.01)

(56) References Cited

U.S. PATENT DOCUMENTS

| | | | |
|---|---|---|---|
| 10,079,201 B1* | 9/2018 | Oku | H01L 23/49551 |
| 10,367,127 B2* | 7/2019 | Fukuda | H01L 33/62 |
| 2010/0195308 A1* | 8/2010 | Lin | H01L 33/62 |
| | | | 362/84 |
| 2012/0025361 A1* | 2/2012 | Ito | H01L 23/047 |
| | | | 257/676 |
| 2012/0061695 A1* | 3/2012 | Kim | H01L 33/486 |
| | | | 257/88 |
| 2012/0162984 A1* | 6/2012 | Fujimori | H01L 33/62 |
| | | | 362/235 |
| 2013/0161670 A1* | 6/2013 | Peng | H01L 33/647 |
| | | | 257/98 |
| 2013/0292812 A1* | 11/2013 | Seo | H01L 33/62 |
| | | | 257/676 |
| 2014/0008673 A1* | 1/2014 | Lee | H01L 25/0753 |
| | | | 257/89 |
| 2014/0103375 A1* | 4/2014 | Kobayakawa | H01L 23/49503 |
| | | | 257/91 |
| 2015/0236231 A1* | 8/2015 | Kobayakawa | H01L 23/49541 |
| | | | 257/98 |
| 2018/0114744 A1* | 4/2018 | Brandl | H01L 23/49541 |

\* cited by examiner

LED HOLDER, LED MODULE AND METHOD FOR MANUFACTURING LED HOLDER

FIELD OF THE DISCLOSURE

The disclosure relates to the field of packaging technologies, and more particularly to a light emitting diode (LED) holder, an LED module and a method for manufacturing a LED holder.

BACKGROUND

A packaging substrate for packaging an LED chip, also called as SMD (surface mounted device) holder, is mainly formed by combining an etched sheet and a white shell in conventional manufacturing processes. The etched sheet may be a conductive material such as ceramic, iron, copper or aluminum. The white shell can be an insulating material of a resin such as PPA, PCT, EMC, or SMC.

In common, the etched sheet is etched to form a flat with positive electrodes and negative electrodes, and then the resin is injected to combine with the etched sheet and to form the white shell, by injection molding. In order to facilitate directional illumination, most white shells are cup-shaped, thereby forming the package base.

Conventional package bases often have the following problems. First, an inner side reflective surface of the cup-shaped is used to reflect light from the LED chip, the reflectivity is relatively low. Second, the white shell will turn yellow after aging.

Therefore, for the white shell in the package base, how to improve the reflectivity and yellowing after aging has become one of the problems to be solved by those skilled in the art.

SUMMARY

On such basis, the disclosure provides a LED module, a LED holder, and a method for manufacturing the LED holder, so as to solve the above problems existing in related art.

In the disclosure, a LED holder is provided. The LED holder comprises an insulating carrier and a lead frame fixed with the insulating carrier. The insulating carrier comprises a first sidewall, a second sidewall and a partition portion, the first sidewall is opposite to the second sidewall, the partition portion is positioned between the first sidewall and the second sidewall, the first sidewall has a sloped first inner side surface, and the second sidewall has a sloped second inner side surface. The lead frame comprises a first electrode and a second electrode, the first electrode and the second electrode are positioned at two opposite sides of the partition portion and are insulated from each other by the partition portion, the first electrode comprises a first bottom portion and a first wing portion connected to the first bottom portion, the first bottom portion is adjacent to the partition portion of the insulating carrier, the first wing portion extends from the first bottom portion and bends towards the first inner side surface and further locates on the first inner side surface, the second electrode comprises a second bottom portion and a second wing portion connected to the second bottom portion, the second bottom portion is adjacent to the partition portion of the insulating carrier, the second wing portion extends from the second bottom portion and bends towards the second inner side surface and further locates on the second inner side surface.

In an embodiment, the insulating carrier further comprises a third sidewall and a fourth sidewall opposite to the third sidewall, the third sidewall has a sloped third inner side surface, the fourth sidewall has a sloped fourth inner side surface; the first sidewall, the third sidewall, the second sidewall and the fourth sidewall are sequentially connected in that order.

In an embodiment, the partition portion is connected between the third sidewall and the fourth sidewall; the first electrode further comprises two first secondary wing portions, the two first secondary wing portions extend from the first bottom portion and respectively bend towards the third inner side surface and the fourth inner side surface and further respectively locate on the third inner side surface and the fourth inner side surface; the second electrode further comprises two second secondary wing portions, the two second secondary wing portions extend from the second bottom portion and respectively bend towards the third inner side surface and the fourth inner side surface and further respectively locate on the third inner side surface and the fourth inner side surface.

In an embodiment, the partition portion is connected with two opposite sides of the first sidewall, and the partition portion is substantially U-shaped; the second electrode further comprises a third wing portion and a fourth wing portion, the third wing portion extends from the second bottom portion and bends towards the third inner side surface and further locate on the third inner side surface, the fourth wing portion extends from the second bottom portion and bends towards the fourth inner side surface and further locates on the fourth inner side surface.

In an embodiment, the first electrode further comprises at least one first branch portion, the first branch portion extends from the first bottom portion towards an end of the first sidewall and penetrates through the first sidewall.

In an embodiment, a thickness of the first branch portion is equal to a thickness of the first bottom portion, and the first branch portion is exposed from a bottom surface and a side surface of the first sidewall.

In an embodiment, a thickness of the first branch portion is less than a thickness of the first bottom portion, and the first branch portion is exposed from a side surface of the first sidewall.

In an embodiment, the first electrode further comprises at least one first branch portion coplanar with the first bottom portion, the first branch portion extends from a corner of the first bottom portion toward a direction away from the first bottom portion, and the first branch portion is partially exposed from the first sidewall.

In an embodiment, an intersection angle between the first bottom portion and the first wing portion is in a range of 93-120 degrees, and an intersection angle between the second bottom portion and the second wing portion is in a range of 93-120 degrees.

In an embodiment, the first electrode further comprises at least one first branch portion, the first branch portion extends from a corner of the first bottom portion towards a direction away from the first bottom portion, and the first branch portion is partially exposed from the first sidewall. The second electrode further comprises at least one second branch portion, the second branch portion extends from a corner of the second bottom portion towards a direction away from the second bottom portion, and the second branch portion is partially exposed from the second sidewall. The first bottom portion, the second bottom portion, the first branch portion, and the second branch portion are coplanar.

In an embodiment, an intersection angle between the first bottom portion and the first secondary wing portions is equal to an intersection angle between the second bottom portion and the second secondary wing portions.

In an embodiment, the intersection angle between the first bottom portion and the first secondary wing portions is in a range of 93-120 degrees.

A method for manufacturing a LED holder is provided. The method comprises: forming a plurality of connected lead frames, wherein each of the lead frames comprises a first electrode and a second electrode, the first electrode comprises a first bottom portion and a first wing portion connected with the first bottom portion, the first wing portion extends from the first bottom portion and bends towards a direction away from the first bottom portion, the second electrode comprises a second bottom portion and a second wing portion connected with the second bottom portion, the second wing portion extends from the second bottom portion and bends towards a direction away from the second bottom portion; disposing the plurality of connected lead frames in a mold, and forming a plurality of connected insulating carriers on the plurality of connected lead frames in the mold by injection molding, wherein each of the insulating carriers comprises a first sidewall, a second sidewall and a partition portion, the first sidewall is opposite to the second sidewall, the partition portion is positioned between the first sidewall and the second sidewall, the first sidewall has a sloped first inner side surface, the second sidewall has a sloped second inner side surface, the first wing portion is located on the first inner side surface, and the second wing portion is located on the second inner side surface; and cutting the plurality of connected lead frames and the plurality of connected lead frames along cutting slits, thereby obtaining a plurality of separated LED holders, wherein each of the LED holders comprises one of the lead frames and one of the insulating carriers fixed with the lead frame.

In an embodiment, the step of forming a plurality of connected lead frames comprises: providing a substrate; forming a predetermined pattern on the substrate by at least one of etching, cutting and punching, wherein the predetermined pattern comprises the first bottom portion, the first wing portion, the second bottom portion and the second wing portion that are coplanar, and bending the first wing portion relative to the first bottom portion, and bending the second wing portion relative to the second bottom portion, thereby obtaining the plurality of connected lead frames.

In an embodiment, the plurality of connected lead frames are connected by a plurality of connecting branch portions, each of the connecting branch portions is formed by outwardly extending from the first bottom portion and the second bottom portion; and in the step of cutting the plurality of connected lead frames and the plurality of connected lead frames along cutting slits, each of the connecting branch portions is cut off to form a first branch portion of the first electrode and a second branch portion of the second electrode.

A LED module is provided. The LED module comprises an insulating carrier, a lead frame and a LED chip, and the lead frame is fixed with the insulating carrier. The insulating carrier comprises a first sidewall, a second sidewall and a partition portion, the first sidewall is opposite to the second sidewall, the partition portion is positioned between the first sidewall and the second sidewall, the first sidewall has a sloped first inner side surface, and the second sidewall has a sloped second inner side surface. The lead frame comprises a first electrode and a second electrode, the first electrode and the second electrode are positioned at two opposite sides of the partition portion and are insulated from each other by the partition portion, the first electrode comprises a first bottom portion and a first wing portion connected to the first bottom portion, the first bottom portion is adjacent to the partition portion of the insulating carrier, the first wing portion extends from the first bottom portion and bends towards the first inner side surface and further locates on the first inner side surface; the second electrode comprises a second bottom portion and a second wing portion connected to the second bottom portion, the second bottom portion is adjacent to the partition portion of the insulating carrier, the second wing portion extends from the second bottom portion and bends towards the second inner side surface and further locates on the second inner side surface. The LED chip is electrically coupled to the first bottom portion and the second bottom portion.

In the embodiments of the disclosure, the lead frame of the above-mentioned LED holder and the above-mentioned LED module includes the first electrode and the second electrode, and the first wing portion of the first electrode is bent from the first bottom portion toward the first inner side surface of the first sidewall and is located on the first inner side surface, the second wing portion of the second electrode is bent from the second bottom portion toward the second inner side surface of the second sidewall and is located on the second inner side surface; the first wing portion and the second wing portion can shield most of the surface of the insulating carrier, so when it is assembled into the LED module, lights can be prevented from being irradiated to the insulating carrier to deteriorate the insulating carrier, or the problem of the material of the insulating carrier itself is not high reflectivity can be avoided. Therefore, the LED holder can improve the reflectivity of the LED module, and the packaged LED module can be protected from material aging, thereby effectively extending the service life of the LED module product.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the drawings.

DETAILED DESCRIPTION OF PREFERRED EMBODIMENTS

Figure 1:
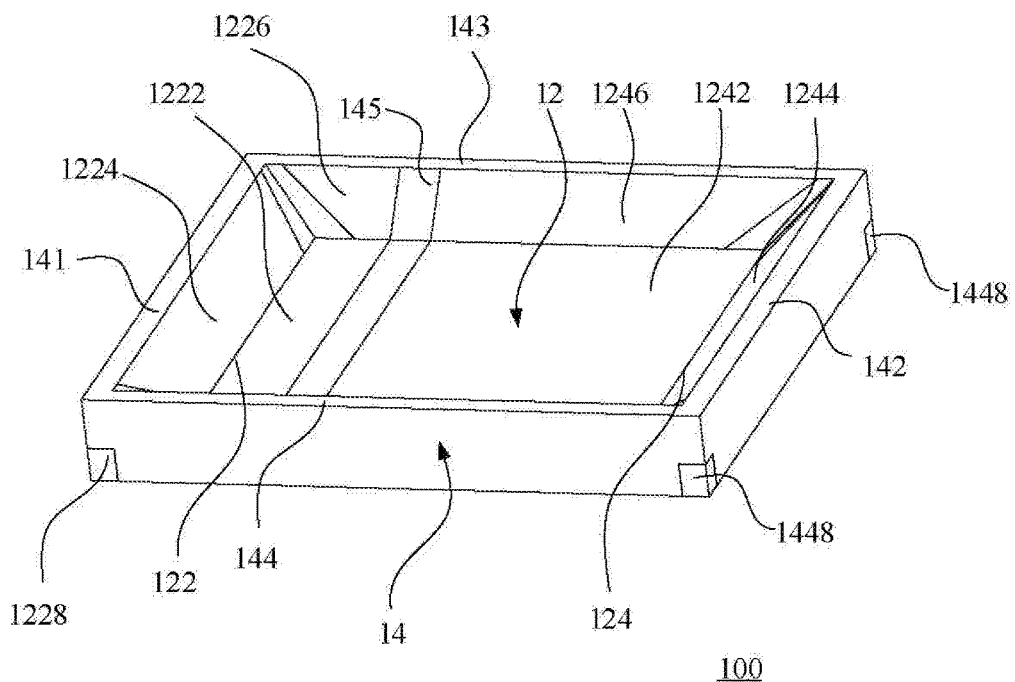
FIG. 1 is a stereoscopic diagram of a LED holder according to a first embodiment of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

Figure 2:
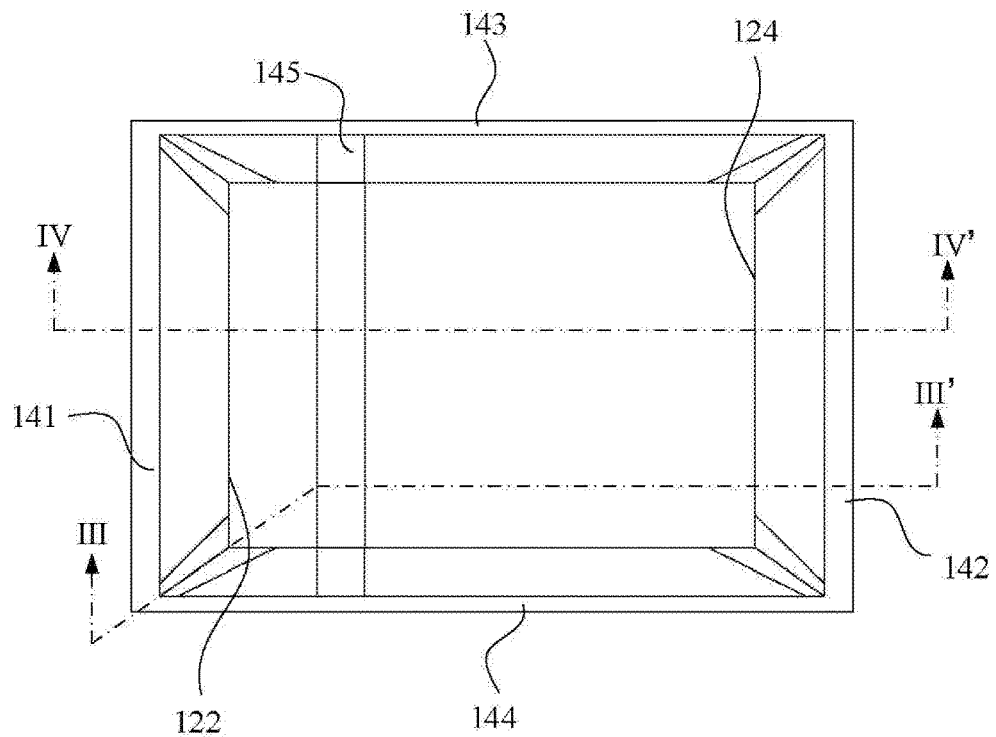
FIG. 2 is a top view of the LED holder shown in FIG. 1.
Figure 3:
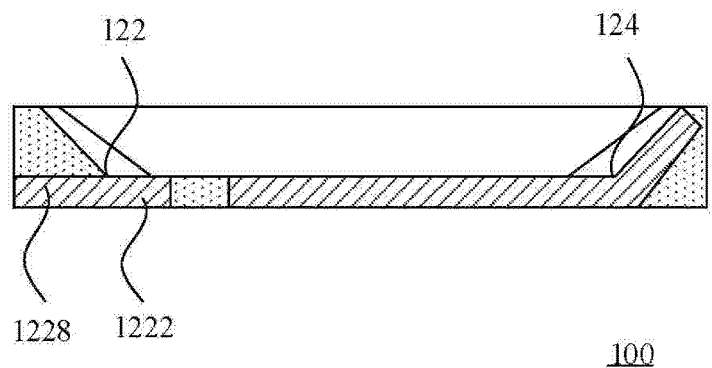
FIG. 3 is a cross-sectional view of the LED holder shown in FIG. 2 taken along line III-III'.
Figure 4:
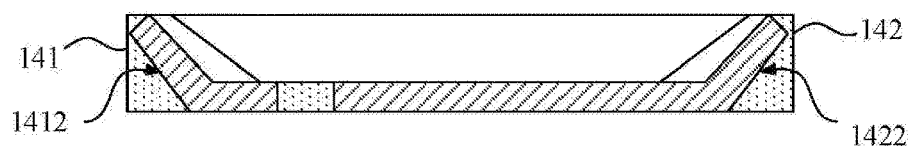
FIG. 4 is a cross-sectional view of the LED holder shown in FIG. 2 taken along line IV-IV'.

FIG. 1 is a stereoscopic diagram of a LED holder according to a first embodiment of the disclosure. FIG. 2 is a top view of the LED holder shown in FIG. 1. FIG. 3 is a cross-sectional view of the LED holder shown in FIG. 2 taken along line III-III'. FIG. 4 is a cross-sectional view of the LED holder shown in FIG. 2 taken along line IV-IV. Referring to FIG. 1 to FIG. 4, the first embodiment provides a LED holder 100, which includes a lead frame 12 and an insulating carrier 14. The lead frame 12 is fixed with the insulating carrier 14. The insulating carrier 14 includes a first sidewall 141, a second sidewall 142, and a partition portion 145. The partition portion 145 is located between the first sidewall 141 and the second sidewall 142. The first sidewall 141 has a sloped first inner side surface 1412 and the second sidewall 142 has a sloped second inner side surface 1422. The lead frame 12 includes a first electrode 122 and a second electrode 124. The first electrode 122 and the second electrode 124 are located on two opposite sides of the partition portion 145 and are insulated from each other by the partition portion 145. The first electrode 122 includes a first bottom portion 1222 and a first wing portion 1224 connected with the first bottom portion 1222. The first bottom portion 1222 is adjacent to the partition portion 145 of the insulating carrier 14. The first wing portion 1224 extends from the first bottom portion 1222 and bends towards the first inner side surface 1412 of the first sidewall 141, and further is located on and in contact with the first inner side surface 1412. The second electrode 124 includes a second bottom portion 1242 and a second wing portion 1244 connected with the second bottom portion 1242. The second bottom portion 1242 is adjacent to the partition portion 145 of the insulating carrier 14. The second wing portion 1244 extends from the second bottom portion 1242 and bends towards the second inner side surface 1422 of the second sidewall 142, the second wing portion 1244 further is located on and in contact with the second inner side surface 1422.

In the LED holder 100 as described above, the lead frame 12 includes the first electrode 122 and the second electrode 124, the first wing portion 1224 bends from the first bottom portion 1222 toward the first inner side surface 1412 and is attached on the first inner side surface 1412, the second wing portion 1244 extends from the second bottom portion 1242 and bends towards the second inner side surface 1422 and is attached on the second inner side surface 1422. As such, the first wing portion 1224 and the second wing portion 1244 can shield the insulating carrier 14, so that when it is assembled into an LED module, light can be prevented from directly illuminating the insulating carrier 14, thereby preventing the insulating carrier 14 from aging and being yellowed, or avoiding the problem that the material of the insulating carrier 14 itself is not highly reflective. Therefore, the LED holder 100 can improve the reflectivity of the LED module, and can prevent the packaged LED module from being affected by the aging of the material, thereby effectively extending the service life of the LED module.

Specifically, in the embodiment, the LED holder 100 can be a rectangular hollow cup-shaped structure. The insulating carrier 14 may further include a third sidewall 143 and a fourth sidewall 144 opposite to the third sidewall 143. The third sidewall 143 has a sloped third inner side surface. The fourth sidewall 144 has a sloped fourth inner side surface. The first sidewall 141, the third sidewall 143, the second sidewall 142, and the fourth sidewall 144 are sequentially connected in that order. The partition portion 145 is connected between the third sidewall 143 and the fourth sidewall 144, and divides the third sidewall 143 into two parts, also divides the fourth sidewall 144 into two parts. The first electrode 122 further includes two first secondary wing portions 1226. The two first secondary wing portions 1226 extend from the first bottom portion 1222 and bend towards the third inner side surface and the fourth inner side surface, respectively. The two first secondary wing portions 1226 also are located on the third inner side surface and the fourth inner side surface, respectively. That is, one of the two first secondary wing portions 1226 extends from the first bottom portion 1222 and bends towards the third inner side surface, and further is located on the third inner side surface, and the other first time wing portion 1226 extends from the first bottom portion 1222 and bends towards the fourth inner side surface, and further is located on the fourth inner side surface. The second electrode 124 further includes two second secondary wing portions 1246. The two second secondary wing portions 1246 extend from the second bottom portion 1242 and respectively bend towards the third inner side surface and the fourth inner side surface, and are respectively located on the third inner side surface and the fourth inner side surface. That is, one second secondary wing portion 1246 extends from the second bottom portion 1242 and bends towards the third inner side surface, and further is positioned on the third inner side surface, the other second secondary wing portion 1246 extends from the second bottom portion 1242 and bends towards the fourth inner side surface, and further is positioned on the fourth inner side surface. The first wing portion 1224, the second wing portion 1244, the first secondary wing portions 1226, and the second secondary wing portions 1246 each may have a bending angle α in a range of 45-90 degrees, preferably in a range of 60-87 degrees. In other words, an intersection angle β between the wing portions and the bottom portions are 90-135 degrees, preferably in a range of 93-120 degrees.

In an alternative embodiment, the first wing portion 1224 and the second wing portion 1244 may be omitted, that is, the first electrode 122 just include the first secondary wing portions 1226 and the first bottom portion 1222, and the second electrode 124 just include the second secondary wing portions 1246 and the second bottom portion 1242.

The first electrode 122 further includes at least one first branch portion 1228. The first branch portion 1228 extends from the first bottom portion 1222 and towards an end of the first sidewall 141 and penetrates through the first sidewall 141. Specifically, the first branch portion 1228 is the same thickness as the first bottom portion 1222. The number of the first branch portion 1228 may be two, one first branch portion 1228 extends towards the junction/corner of the first sidewall 141 and the third sidewall 143 and is exposed from side surfaces of the first sidewall 141 and the third sidewall 143 and a bottom surface of the LED holder 100, the other first branch portion 1228 extends towards the junction/corner of the first sidewall 141 and the fourth sidewall 144 and is exposed from side surfaces of the first sidewall 141 and the fourth sidewall 144 and a bottom surface of the LED holder 100. Exposed portions of the first branch portions 1228 exposed from the first sidewall 141, the third sidewall 143, and the fourth sidewall 144 are not plated, but exposed portions of the first branch portions 1228 exposed from the bottom surface of the LED holder 100 are plated.

The second electrode 124 further includes at least one second branch portion 1448. The second branch portion 1448 extends from the second bottom portion 1242 towards an end of the second sidewall 142 and penetrates through the second sidewall 142. Specifically, the second branch portion 1448 is the same thickness as the second bottom portion 1242. The number of the second branch portion 1448 may be two, one second branch portion 1448 extends towards the junction/corner of the second sidewall 142 and the third sidewall 143 and is exposed from side surfaces of the second sidewall 142 and the third sidewall 143 and a bottom surface of the LED holder 100, the other second branch portion 1448 extends towards the junction/corner of the second sidewall 142 and the fourth sidewall 144 and is exposed from side surfaces of the second sidewall 142 and the fourth sidewall 144 and a bottom surface of the LED holder 100. Exposed portions of the second branch portions 1448 exposed from the second sidewall 142, the third sidewall 143, and the fourth sidewall 144 are not plated, but exposed portions of the second branch portions 1448 exposed from the bottom surface of the LED holder 100 are plated.

The insulating carrier 14 may be made of a resin, such as PPA, PCT, EMC, and SMC. The lead frame 12 may be a material such as iron, copper, aluminum, etc., which may be formed into a predetermined shape by cutting, etching, and/or stamping, etc., and then the surface thereof may be plated with a metal with high reflectivity and conductive property, such as silver.

Figure 5:
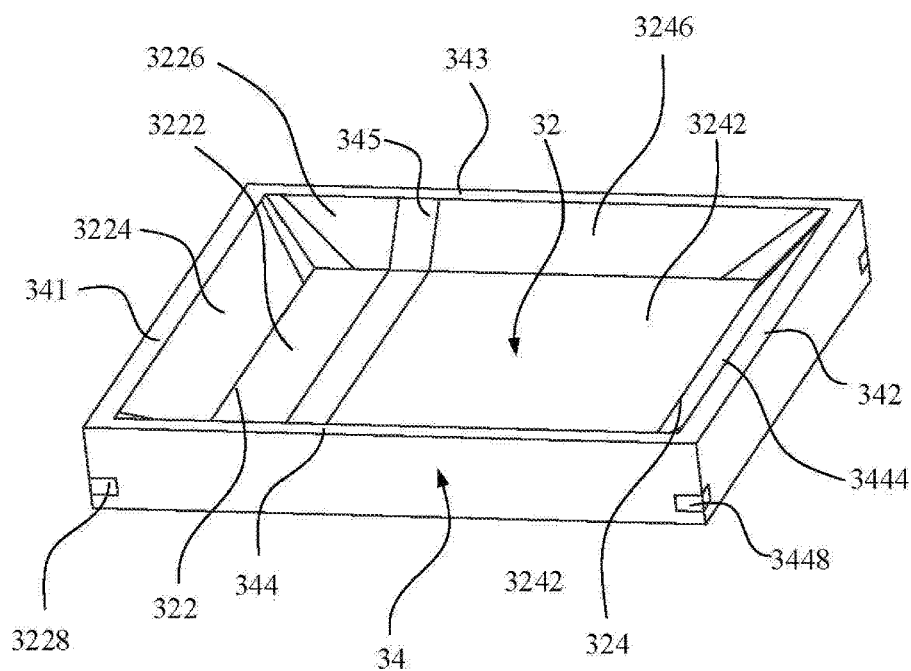
FIG. 5 is a stereoscopic diagram of a LED holder according to a second embodiment of the disclosure.
Figure 6:
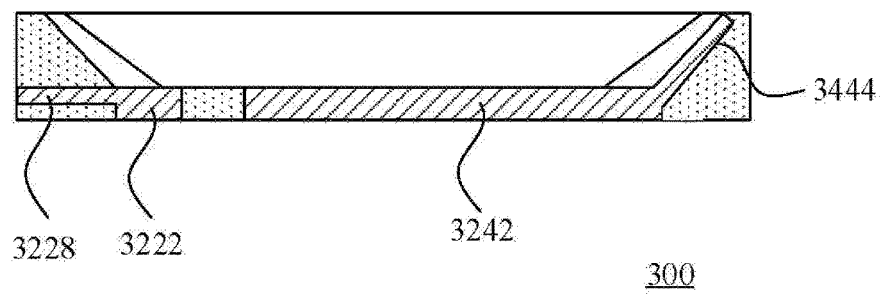
FIG. 6 is a cross-sectional view of the LED holder shown in FIG. 5.

FIG. 5 is a stereoscopic diagram of a LED holder according to a second embodiment of the disclosure. FIG. 6 is a cross-sectional view of the LED holder shown in FIG. 5. The second embodiment provides a LED holder 300, which is similar to the LED holder 100 of the first embodiment and also includes a lead frame 32 and an insulating carrier 34. The lead frame 32 is fixed with the insulating carrier 34. The insulating carrier 14 includes a first sidewall 341, a second sidewall 342, a third sidewall 343, a fourth sidewall 344, and a partition portion 345. The first sidewall 341, the third sidewall 343, the second sidewall 342, and the fourth sidewall 344 are sequentially connected in that order. The lead frame 32 includes a first electrode 322 and a second electrode 324. The first electrode 322 may include a first bottom portion 3222, a first wing portion 3224, two first secondary wing portions 3226, and two first branch portions 3228. The second electrode 324 may include a second bottom portion 3442, a second wing portion 3444, two second secondary wing portions 3446, and two second branch portions 3448.

The differences between the LED holder 300 of the second embodiment and the LED holder 100 of the first embodiment are described as follows. A thickness of the first branch portion 3228 is less than a thickness of the first bottom portion 3222. One of the first branch portions 3228 extends toward the junction/corner of the first sidewall 341 and the third sidewall 343, and is exposed from side surfaces of the first sidewall 341 and the third sidewall 343, but is not exposed from a bottom surface of the LED holder 300. The other first branch portion 3228 extends toward the junction/corner of the first sidewall 341 and the fourth sidewall 344, and is exposed from side surfaces of the first sidewall 341 and the fourth sidewall 344, but is not exposed from the bottom surface of the LED holder 300. The exposed portions of the first branch portions 3228 may not be plated. A thickness of the second branch portion 3448 is less than a thickness of the second bottom portion 3242. One of the second branch portions 3448 extends toward the junction/corner of the first sidewall 341 and the third sidewall 343, and is exposed from side surfaces of the second sidewall 342 and the third sidewall 343, but is not exposed from the bottom surface of the LED holder 300. The other second branch portion 3448 extends toward the junction/corner of the second sidewall 342 and the fourth sidewall 344, and is exposed from side surfaces of the second sidewall 342 and the fourth sidewall 344, but is not exposed from the bottom surface of the LED holder 300. The exposed portions of the second branch portions 3448 may not be plated.

The first branch portions 3228 and the second branch portions 3448 each are partially exposed from side surfaces of the insulating carrier 34, and most thereof are encapsulated by the insulating carrier 34. As such, combination between the lead frame 32 and the insulating carrier 34 can be improved, thereby improving the connection strength between the lead frame 32 and the insulating carrier 34.

Further, a thickness of the first wing portion 3224 and the first secondary wing portions 3226 may be smaller than the thickness of the first bottom portion 3222, and a thickness of the second wing portion 3444 and the second secondary wing portions 3446 may be smaller than the thickness of the second bottom portion 3442.

Figure 7:
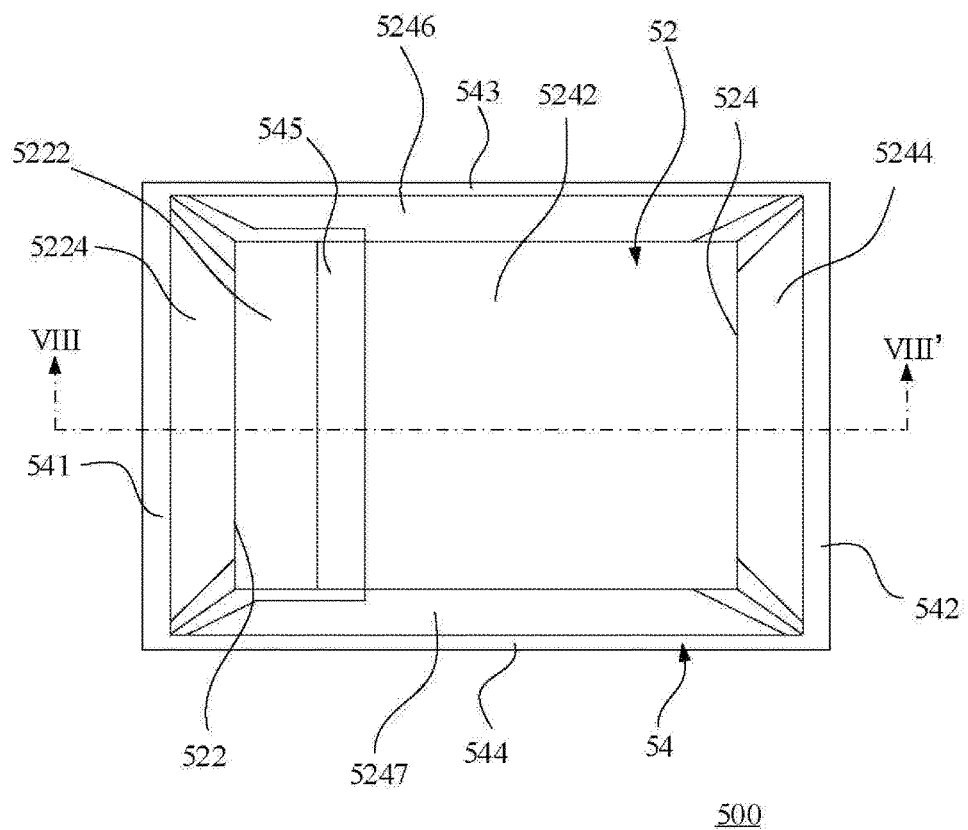
FIG. 7 is a top view of a LED holder according to a third embodiment of the disclosure.
Figure 8:
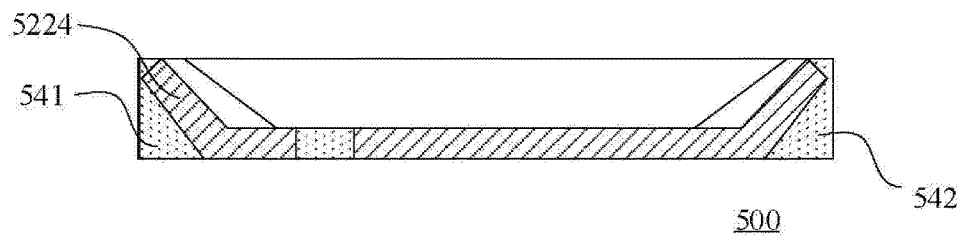
FIG. 8 is a cross-sectional view of the LED holder shown in FIG. 7 taken along line VIII-VIII'.

FIG. 7 is a top view of a LED holder according to a third embodiment of the disclosure. FIG. 8 is a cross-sectional view of the LED holder shown in FIG. 7 taken along line VIII-VIII'. Referring to FIG. 7 and FIG. 8, the third embodiment provides a LED holder 500, which is similar to the LED holder 100 of the first embodiment and also includes a lead frame 52 and an insulating carrier 54. The lead frame 52 is fixed in combination with the insulating carrier 54. The insulating carrier 54 includes a first sidewall 541, a second sidewall 542, a third sidewall 543, a fourth sidewall 544, and a partition portion 545. The first sidewall 541, the third sidewall 543, the second sidewall 542, and the fourth sidewall 544 are sequentially connected in that order. The lead frame 52 includes a first electrode 522 and a second electrode 524.

The differences between the LED holder 500 of the third embodiment and the LED holder 100 of the first embodiment are described as follows. The partition portion 545 is connected between two opposite sides of the first sidewall 541. The partition portion 545 is substantially formed in a U-shaped, an open side of the U-shaped partition portion 545 faces the first sidewall 541, and two opposite arms of the U-shaped partition portion 545 are located on the third sidewall 543 and the fourth sidewall 544, respectively, so that the first electrode 522 and the second electrode 524 are spaced and insulated from each other. The first electrode 522 includes a first wing portion 5224 connected with a first bottom portion 5222, and the second electrode 524 includes a second wing portion 5244, a third wing portion 5246, and a fourth wing portion 5247 each connected with a second bottom portion 5242. The first wing portion 5224 extends towards a sloped first inner side surface of the first sidewall 541 and is located on the first inner side surface. The second wing portion 5244 extends towards a sloped second inner side surface of the second sidewall 542 and is located on the second inner side surface. The third wing portion 5246 extends towards a sloped third inner side surface of the third sidewall 543 and is located on the third inner side surface. The fourth wing portion 5247 extends towards a sloped fourth inner side surface of the fourth sidewall 544 and is located on the fourth inner side surface. Specifically, the first bottom portion 5222 is adjacent to an inner side of the U-shaped partition portion 545, and the third wing portion 5246, the second bottom portion 5242, and the fourth wing portion 5247 each are adjacent to an outer side of the U-shaped partition portion 545.

In an alternative embodiment, the first wing portion 5224 and the second wing portion 5244 may be omitted, that is, the second electrode 522 just include the third wing portion 5246 and the fourth wing portion 5247.

In addition, the first electrode 522 may further include at least one first branch portion, the second electrode 524 may further include at least one second branch portion. The first branch portion and the second branch portion may have structures the same as described in the above embodiments, and details are not described in this embodiment.

Figure 9:
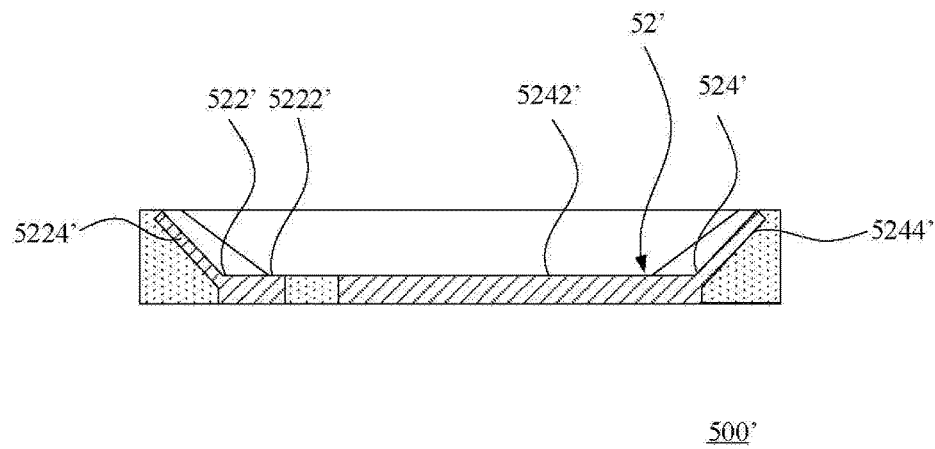
FIG. 9 is a cross-sectional view of a LED holder according to a fourth embodiment of the present disclosure.

FIG. 9 is a cross-sectional view of a LED holder according to a fourth embodiment of the present disclosure. Referring to FIG. 9, the fourth embodiment provides a LED holder 500' similar to the LED holder 500 of the third embodiment, and differences therebetween are described as follows. In a first electrode 522' and a second electrode 524' of the lead frame 52', a thickness of a first branch portion is less than a thickness of a first bottom portion, and a thickness of a second branch portion also is less than a thickness of a second bottom portion 5442'. A thickness of a first wing portion 5224' is smaller than the thickness of the first bottom portion 5222', a thickness of a second wing portion 5444', a third wing portion, and a fourth wing portion is smaller than the thickness of the second bottom portion 5442'.

Figure 10:
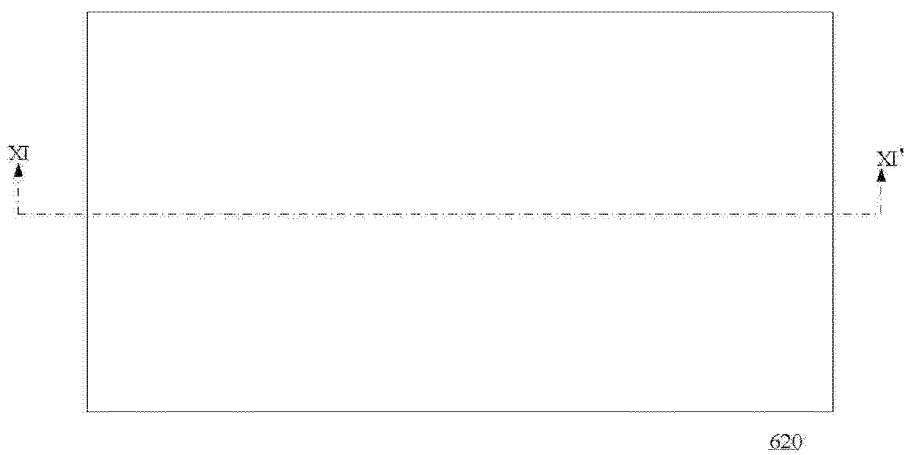
FIG. 10 is a schematic view showing a substrate in a method for manufacturing an LED holder according to a fifth embodiment of the present disclosure.
Figure 11:
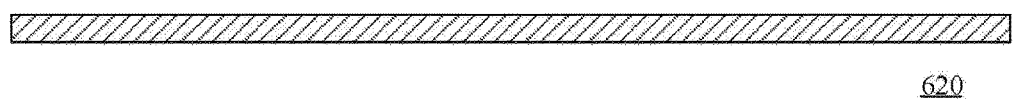
FIG. 11 is a cross-sectional view of the substrate shown in FIG. 10 taken along line XI-XI'.
Figure 12:
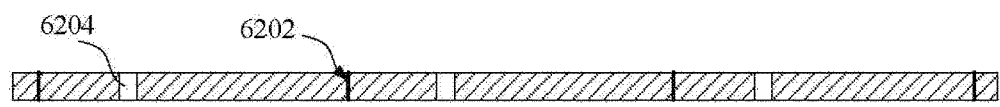
FIG. 12 is a schematic view showing a predetermined pattern is formed in the substrate shown in FIG. 10.
Figure 13:
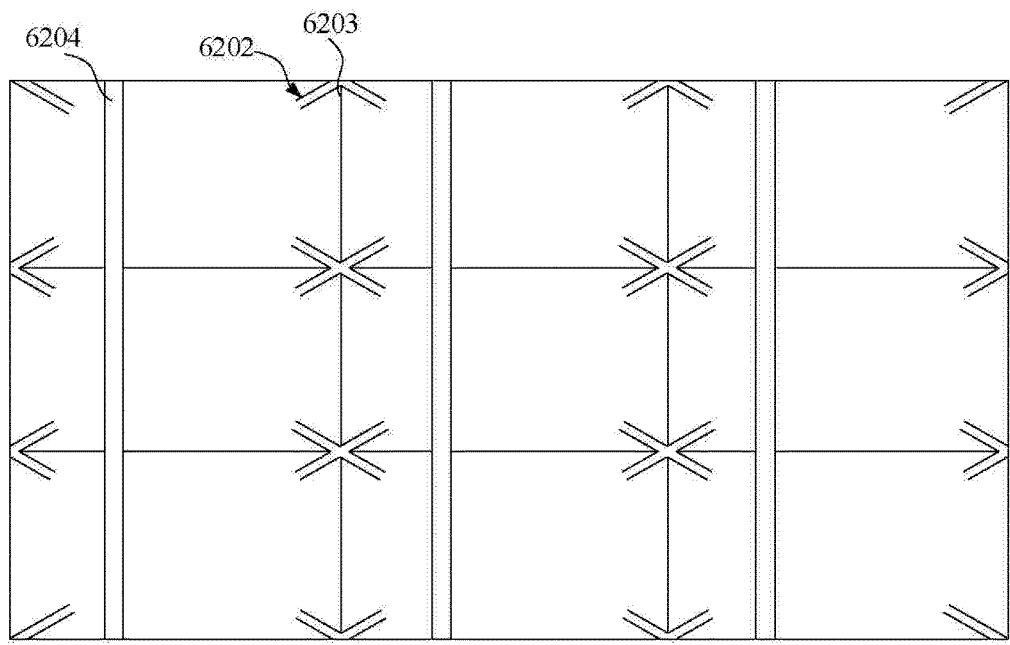
FIG. 13 is a top view of the substrate with the predetermined pattern shown in FIG. 12.
Figure 14:
FIG. 14 is a schematic view showing a plurality of connected lead frames are formed by bending the substrate shown in FIG. 12.
Figure 15:
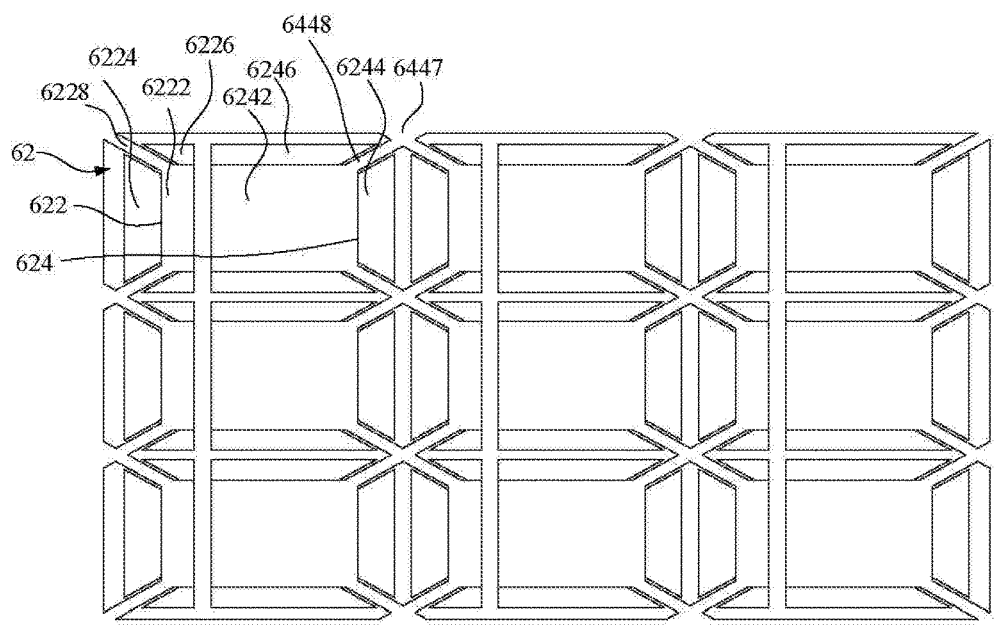
FIG. 15 is a top view of the plurality of connected lead frames shown in FIG. 14.
Figure 16:
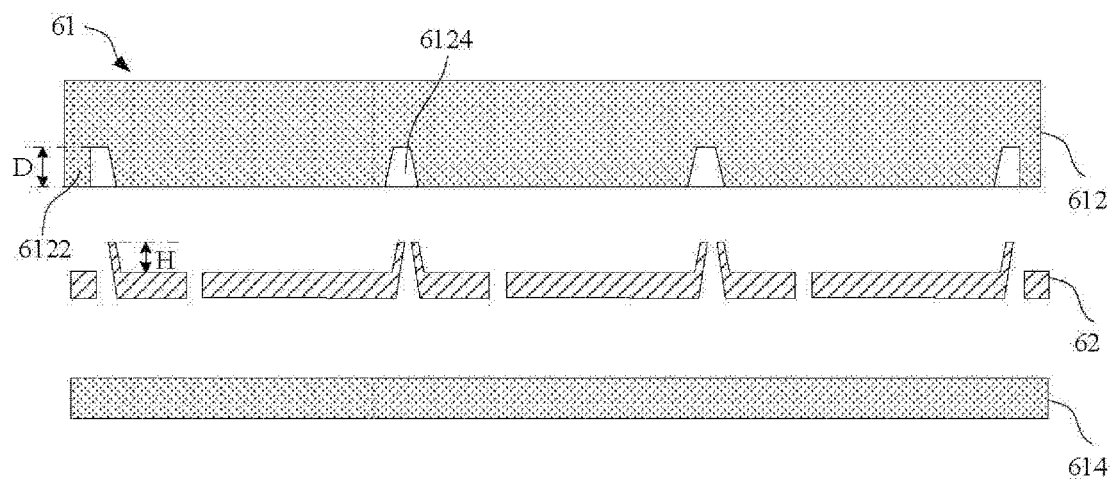
FIGS. 16-18 are schematic views showing processes in which the plurality of connected lead frames shown in FIG. 14 are combined with a plurality of insulating carriers in a mold.
Figure 17:
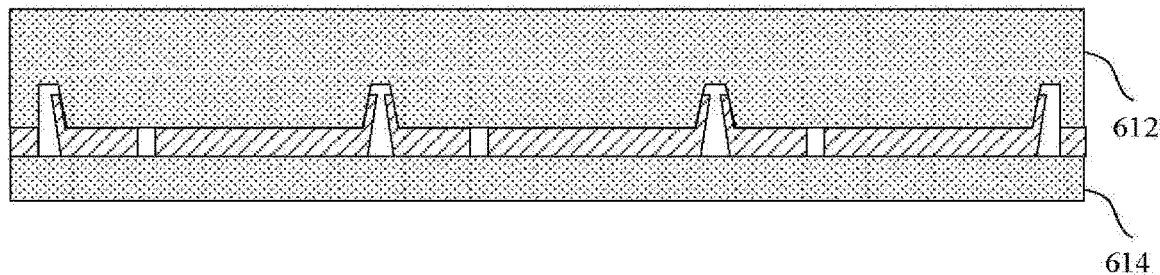
Figure 18:
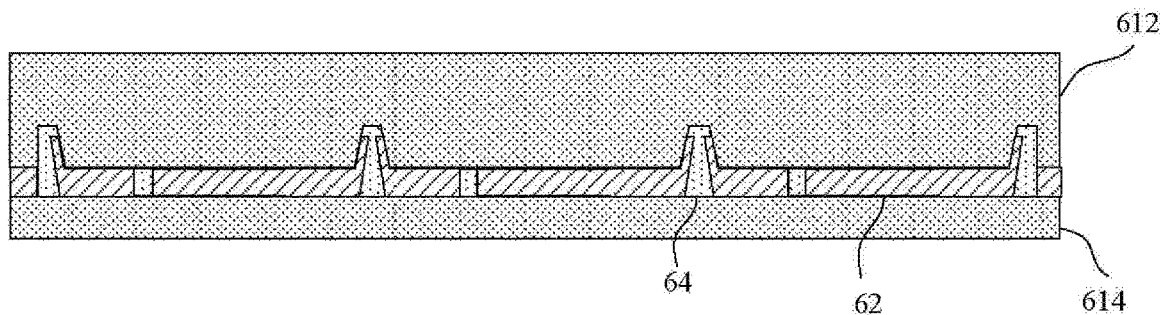
Figure 19:
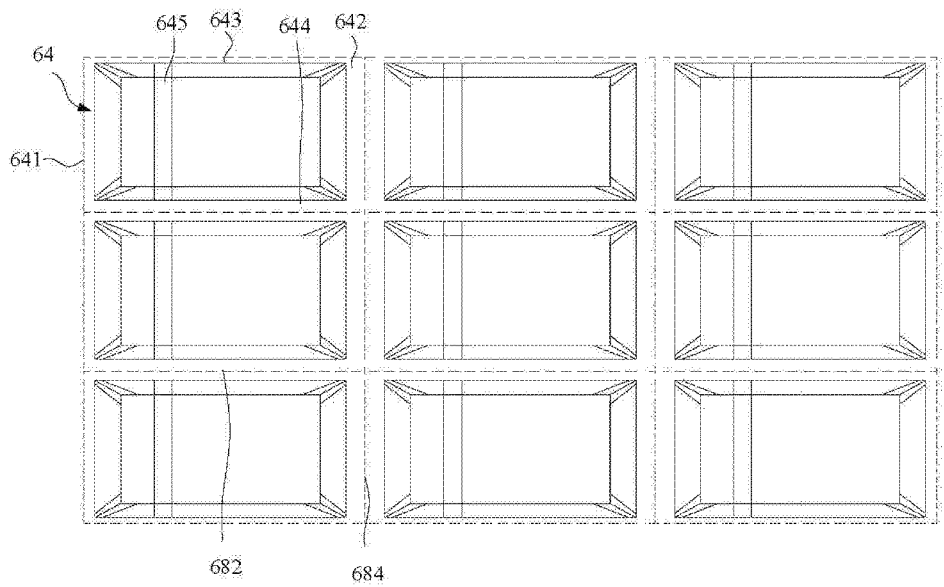
FIG. 19 is a schematic view showing a plurality of LED holders are connected with each other in a method for manufacturing an LED holder, according to a fifth embodiment of the present disclosure.

FIG. 10 is a schematic view showing a substrate in a method for manufacturing an LED holder according to a fifth embodiment of the present disclosure. FIG. 11 is a cross-sectional view of the substrate shown in FIG. 10 taken along line XI-XI'. FIG. 12 is a schematic view showing a predetermined pattern is formed in the substrate of FIG. 10. FIG. 13 is a top view of the substrate with the predetermined pattern of FIG. 12. FIG. 14 is a schematic view showing a plurality of connected lead frames are formed by bending the substrate of FIG. 12. FIG. 15 is a top view of the plurality of connected lead frames of FIG. 14. FIGS. 16-18 are schematic views showing processes in which the plurality of connected lead frames shown in FIG. 14 are combined with a plurality of insulating carriers in a mold. FIG. 19 is a schematic view showing a plurality of LED holders are connected with each other in a method for manufacturing an LED holder, according to the fifth embodiment of the present disclosure. Referring to FIG. 10 to FIG. 19, the fifth embodiment of the disclosure provides a method for manufacturing an LED holder, which includes the following steps.

Step one, as shown in FIG. 15, a plurality of connected lead frames 62 are formed, each of the lead frames 62 includes a first electrode 622 and a second electrode 624. The first electrode 622 includes a first bottom portion 6222 and a first wing portion 6224 connected with the first bottom portion 6222. The first wing portion 6224 extends from the first bottom portion 6222 and bends in a direction away from the first bottom portion 6222. The second electrode 624 includes a second bottom portion 6242 and a second wing portion 6244 connected with the second bottom portion 6242. The second wing portion 6244 extends from the second bottom portion 6242 and bends in a direction away from the second bottom portion 6242. An intersection angle β between the wing portions and the bottom portions may be in a range of 90-135 degrees, preferably in a range of 93-120 degrees.

In the present embodiment, nine connected lead frames 62 are formed in this step as an example. The first electrode 622 further may include two first secondary wing portions 6226 and at least one first branch portion 6228, the first secondary wing portions 6226 and the at least one first branch portion 6228 each are connected to the first bottom portion 6222. The second electrode 624 further may include two second secondary wing portions 6246 and at least one second branch portion 6448, the second secondary wing portions 6246 and the at least one second branch portion 6448 each are connected to the second bottom portion 6242.

Step two, as shown in FIGS. 16 and 19, the plurality of connected lead frames 62 are disposed in a mold 61, in which a plurality of insulating carriers 64 are formed on the connected lead frames 62 by injection molding process. Each of the insulating carriers 64 includes a first sidewall 641, a second sidewall 642, and a partition portion 645. The first sidewall 641 is opposite to the second sidewall 642, and the partition portion 645 is located between the first sidewall 641 and the second sidewall 642. The first sidewall 641 has a sloped first inner side surface and the second side wall 642 has a sloped second inner side surface. The first wing portion 6224 is located on and attached to the first inner side surface and the second wing 6244 is located on and attached to the second inner side surface.

In particular, in the present embodiment, each of the insulating carriers 64 may further include a third sidewall 643 and a fourth sidewall 644 opposite to the third sidewall 643. The third sidewall 643 has a sloped third inner side surface and the fourth sidewall 644 has a sloped fourth inner side surface. The first sidewall 641, the third sidewall 643, the second sidewall 642, and the fourth sidewall 644 are sequentially connected in that order. The partition portion 645 connects the third sidewall 643 and the fourth sidewall 644, and divides the third sidewall 643 into two segments, also divides the fourth sidewall 644 into two segments.

Step three, as shown in FIG. 19, the plurality of connected lead frames 62 and the plurality of connected insulating carriers 64 are cut along cutting slits 682, 684 to form a plurality of separated LED holders. The LED holder may have structures the same as or similar to that of the LED holder 100 of the first embodiment. The cutting slits 682, 684 also can be cutting lines or other separating openings.

Specifically, material of the plurality of connected lead frames 62 may be iron, copper, aluminum, etc., which may be formed into a predetermined shape by cutting, etching, or stamping, etc., and then the surface thereof may be plated with a metal having high reflectivity and conductive property, such as silver.

Referring to FIGS. 10-15, processes of forming the plurality of connected lead frames 62 may include the following steps.

First, a sheet of substrate 620 is provided. The sheet of substrate 620 may be plated with a metal having high reflectivity and conductive property, as shown in FIG. 10 and FIG. 11. The substrate 620 may have a rectangular shape and a uniform thickness throughout.

Next, a predetermined pattern 6202 is formed in the substrate 620 as shown in FIGS. 12 and 13. The predetermined pattern 6202 can be formed by etching or cutting the substrate 620. The predetermined pattern 6202 can define structures of the first electrodes 622 and the second electrodes 624. The predetermined pattern 6202 may further include cutting lines 6203 and via holes 6204, for example, cutting lines are formed around portions waited to form the wing portions or the branch portions, via holes are formed between portions waited to form the first electrodes 622 and portions waited to form the second electrodes 624.

Then, by stamping and bending the substrate with the predetermined pattern 6202, the first electrodes 622 and the second electrodes 624 are formed, as shown in FIGS. 14 and 15. After that, the plurality of connected lead frames 62 can be connected with each other by connecting branch portions 6447. The connecting branch portions 6447 can be formed by a manner that the first bottom portion 6222 of one first electrode 622 and the second bottom portion 6242 of one adjacent second electrode 624 respectively extend outwardly. When the connecting branch portions 6447 are cut off, the first branch portions 6228 of the first electrodes 622 and the second branch portions 6448 of the second electrodes 624 can be formed. In addition, the first wing portion 6224 and two first secondary wing portions 6226 of the first electrode 622 may be bent to a predetermined angle, relative to the first bottom portion 6222; the second wing portion 6244 and two second secondary wing portions 6246 of the second electrode 624 may be bent to a predetermined angle α, relative to the second bottom portion 6242; the predetermined angle α is in a range of 45-90 degrees, preferably in a range of 60-87 degrees.

The material of the insulating carrier 64 may be a resin, for example, a material such as PPA, PCT, EMC, or SMC. As shown in FIGS. 16-18, after the plurality of connected lead frames 62 are disposed in the mold 61, liquefied resin can be injected into a predetermined space provided in the mold 61 from an injection port of the mold 61. After the liquefied resin is cured, a plurality of connected insulating carriers 64 fixed in combination with the plurality of connected lead frames 62 are formed. Specifically in the present embodiment, the mold 61 may include an upper mold 612 and a lower mold 614. The periphery of the upper mold 612 may be provided with a barrier 6122, and a central portion of the upper mold 612 defines recesses 6124 corresponding to the wing portions and the secondary wing portions. One side wall of the recess 6124 is for intimately contacting with a surface of the corresponding wing portion or secondary wing portion. A depth D of the recess 6124 may be equal to or larger than a height H of the wing portion and the secondary wing portion, preferably larger than H. The lower mold 614 is used to fit with a bottom of the lead frame 62. Alternatively, the periphery of the lower mold 614 may also be provided with a barrier. The lower mold 614 cooperates with the upper mold 612 to hold the lead frame 62, thereby preventing the resin material from leaking during injection molding process.

In the manufacturing processes of the LED holder as described above, after the first wing portion 6224 and the second wing portion 6244 are combined with the insulating carrier 64, most of the insulating carrier 64 is shielded. So that when it is assembled into an LED module, light can be prevented from directly illuminating the insulating carrier 64, thereby preventing the insulating carrier 14 from being deteriorated, or avoiding the problem that the material of the insulating carrier 14 itself is not highly reflective. Further, the plurality of connected lead frames 62 are connected with each other by connecting branch portions 6447, so in the manufacturing process, the plurality of connected lead frames 62 can be simultaneously placed in the mold 61 to form the plurality of corresponding insulating carriers 64 thereon, thereby improving the efficiency of production.

Figure 20:
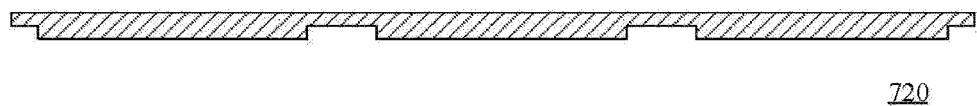
FIG. 20 is a cross-sectional view showing a substrate in a method for manufacturing an LED holder, according to a sixth embodiment of the present disclosure.
Figure 21:
FIG. 21 is a schematic cross-sectional view showing a predetermined pattern is formed in the substrate shown in FIG. 20.
Figure 22:
FIG. 22 is a schematic cross-sectional view showing a plurality of connected lead frames are formed after bending the substrate shown in FIG. 21.
Figure 23:
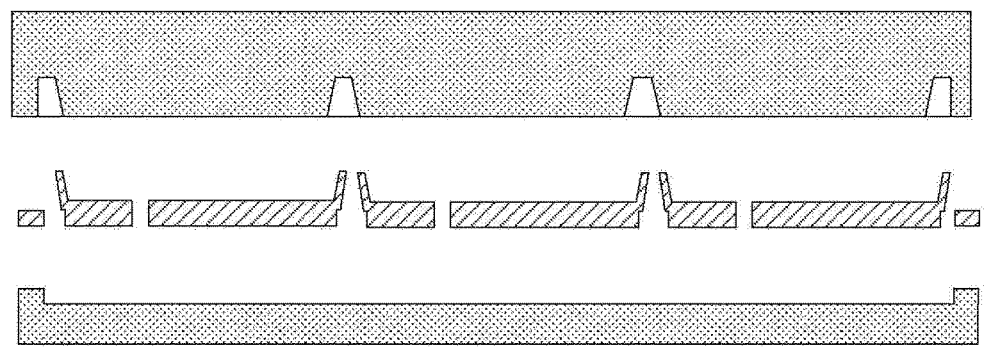
FIGS. 23-25 are schematic views showing processes of combining the plurality of connected lead frames shown in FIG. 22 with a plurality of insulating carriers in a mold.
Figure 24:
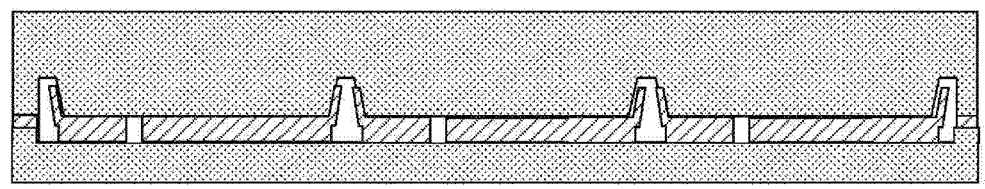
Figure 25:
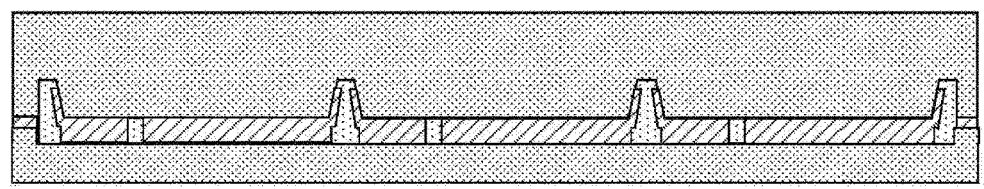

FIG. 20 is a cross-sectional view showing a substrate in a method for manufacturing an LED holder according to a sixth embodiment of the present disclosure. FIG. 21 is a schematic cross-sectional view showing a predetermined pattern is formed in the substrate shown in FIG. 20. FIG. 22 is a schematic cross-sectional view showing a plurality of connected lead frames are formed after bending the substrate shown in FIG. 21. FIGS. 23-25 are schematic views showing processes of combining the plurality of connected lead frames shown in FIG. 22 with a plurality of insulating carriers in a mold. Referring to FIG. 20 to FIG. 25, a sixth embodiment of the present invention further provides a method for manufacturing an LED holder similar to the method of the fifth embodiment, and the differences are described as follows. A sheet of substrate 720 has different thicknesses at different portions thereof, portions of substrate 720 corresponding to wing portions, secondary wing portions, and connecting branch portions have a thickness less than portions of substrates 720 corresponding to bottom portions. That is, in the process of forming the plurality of connected lead frames 72, a first electrode 722 is formed in such a manner that a thickness of a first wing portion, two first secondary wing portions, and at least one first branch portion is less than a thickness of a first bottom portion; a second electrode 724 is formed in such a manner that a thickness of a second wing portion, two second secondary wing portions, and at least one second branch portion is less than a thickness of a second bottom portion.

Referring to FIGS. 20-22, specifically, the processes of forming the plurality of connected lead frames 72 include the following steps.

First, the sheet of substrate 720 is provided. The substrate 720 can be plated with metal having high reflectivity and conductive property, as shown in FIG. 20. The substrate 720 has different thicknesses in different portions.

Next, a predetermined pattern 7202 is formed in the substrate 720, as shown in FIG. 21 and FIG. 22. The predetermined pattern 7202 can be formed by etching or cutting the substrate 720, and the predetermined pattern 7202 defines structures of first electrodes 722 and second electrodes 724. The predetermined pattern 7202 may include cutting lines or via holes 7204. For example, cutting lines are formed surrounding wing portions and branch portions, via holes 7204 are formed between the first electrodes 722 and the second electrodes 724.

It can be understood that in other embodiments, when the substrate provided has a uniform thickness, portions of the substrate can be, for example, etched or cut after forming the predetermined pattern, thereby reducing the thickness of the first wing portion, the first secondary wing portion, and the first branch portion of the first electrode 722, and reducing the thickness of the second wing portion, the second secondary wing portion, and the second branch portion of the second electrode 724.

Figure 26:
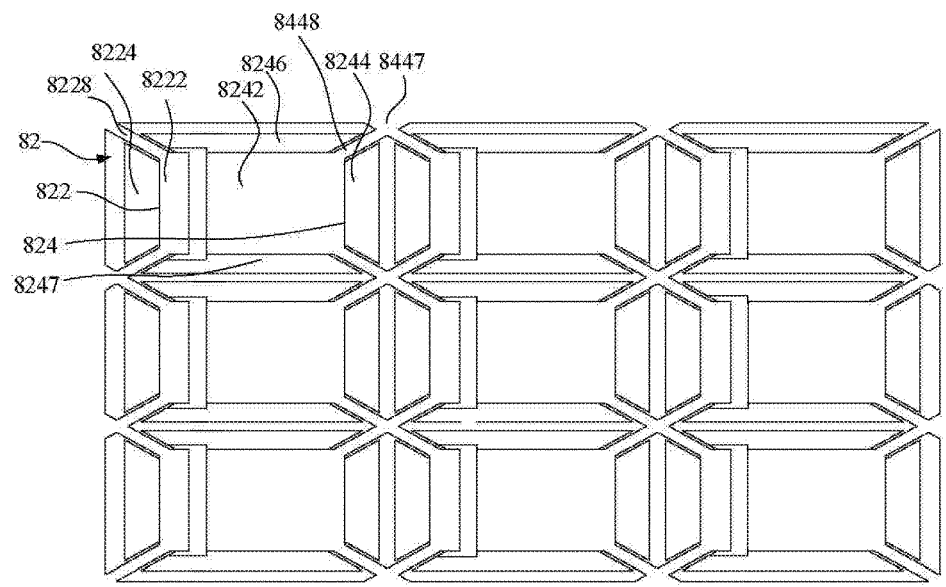
FIG. 26 is a schematic view of a plurality of connected lead frames in a method for manufacturing an LED holder, according to a seventh embodiment of the present disclosure.
Figure 27:
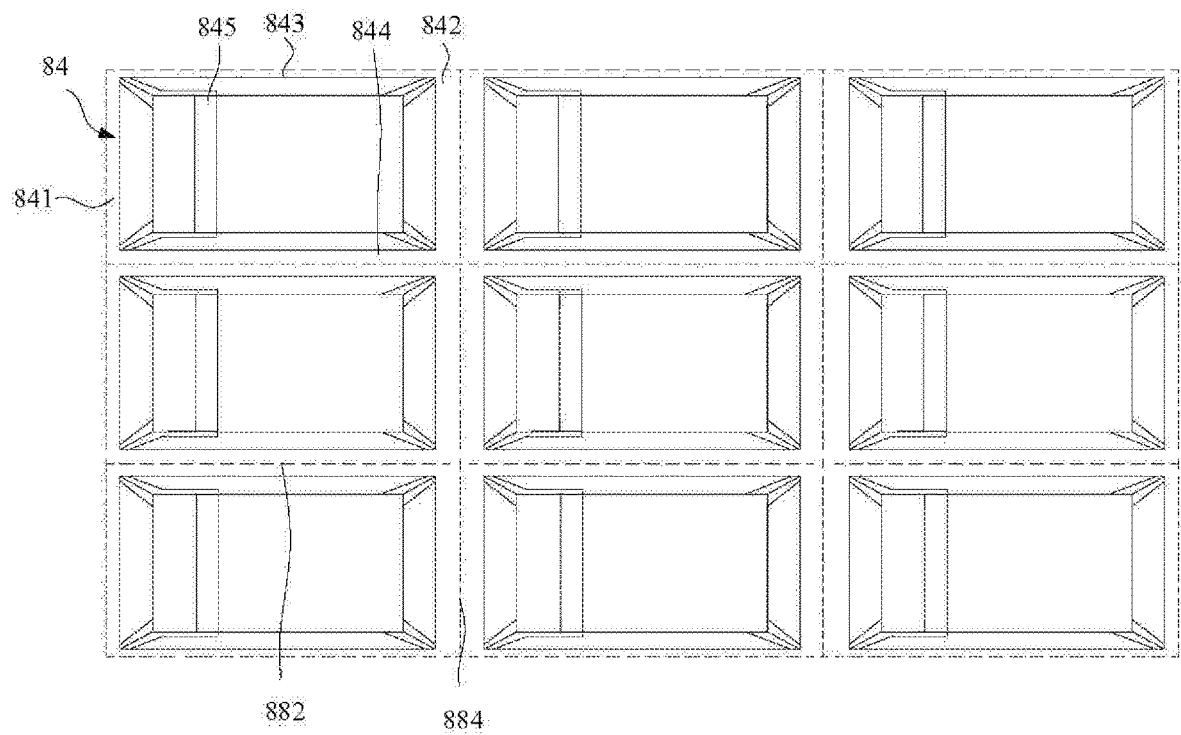
FIG. 27 is a schematic view of a plurality of LED holders connected with each other in a method for manufacturing an LED holder, according to a seventh embodiment of the present disclosure.

FIG. 26 is a schematic view of a plurality of connected lead frames in a method for manufacturing an LED holder, according to a seventh embodiment of the present disclosure. FIG. 27 is a schematic view of a plurality of LED holders connected with each other in a method for manufacturing an LED holder, according to a seventh embodiment of the present disclosure. Referring to FIG. 26 and FIG. 27, the seventh embodiment of the present disclosure provides a method for manufacturing an LED holder similar to the method of the fifth embodiment, and the method of the present embodiment includes the following steps.

Step one, as shown in FIG. 26, a plurality of connected lead frames 82 are formed. Each of the plurality of lead frames 82 includes a first electrode 822 and a second electrode 824. The first electrode 822 includes a first bottom portion 8222 and a first wing portion 8224 connected to the first bottom portion 8222. The first wing portion 8224 extends from the first bottom portion 8222 and bends towards a direction away from the first bottom portion 8222. The second electrode 824 includes a second bottom portion 8242 and a second wing portion 8244 that are connected. The second wing portion 8244 extends from the second bottom portion 8242 and bends towards a direction away from the second bottom portion 8242.

In particular, in this embodiment, the first electrode 822 may further include at least one first branch portion 8228, and the first branch portion 8228 is connected to the first bottom portion 8222. The second electrode 624 further includes a third wing portion 8246, a fourth wing portion 8247, and at least one second branch portion 8448, the third wing portion 8246, the fourth wing portion 8247, and the second branch portion 6448 are respectively connected to the second bottom portion 8242.

Step two, as shown in FIG. 27, the plurality of connected lead frames 82 are disposed in a mold, and a plurality of insulating carriers 84 are formed on the plurality of connected lead frames 82 by injection molding. Each of the insulating carriers 84 includes a first sidewall 841, a second sidewall 842, and a partition portion 845. The first sidewall 841 is opposite to the second sidewall 842, and the partition portion 845 is located between the first sidewall 841 and the second sidewall 842. The first sidewall 841 defines a sloped first inner side surface and the second sidewall 842 defines a sloped second inner side surface. The first wing portion 8224 is located and attached on the first inner side surface and the second wing portion 8244 is located and attached on the second inner side surface.

Specifically, in the present embodiment, each of the insulating carriers 84 may further include a third sidewall 843 and an opposite fourth sidewall 844. The third sidewall 843 defines a sloped third inner side surface and the fourth sidewall 844 defines a sloped fourth inner side surface. The first sidewall 841, the third sidewall 843, the second sidewall 842, and the fourth sidewall 844 are sequentially connected in that order. The partition portion 845 is connected between the third sidewall 843 and the fourth sidewall 844, the partition portion 845 has a substantially U-shape, and an open side of the U-shaped partition portion 845 faces the first sidewall 841, two opposite arms of the U-shaped partition portion 845 are located on the third sidewall 843 and the fourth sidewall 844, respectively. The third wing portion 8246 is located on the third inner side surface and the fourth wing portion 8247 is located on the fourth inner side surface. Specifically, the first bottom portion 8222 is adjacent to an inner side of the U-shaped partition portion 845, and the third wing portion 8246, the second bottom portion 8242, and the fourth wing portion 8247 are respectively adjacent to an outer side of the U-shaped partition portion 845.

In step three, the plurality of connected lead frames 82 and the plurality of connected insulating carriers 84 are cut along the cutting slits 882, 884, to form a plurality of separated LED holders, as shown in FIG. 27. The LED holder has structures may be the same as or similar to the LED holder 500 in the third embodiment of the present disclosure.

Figure 28:
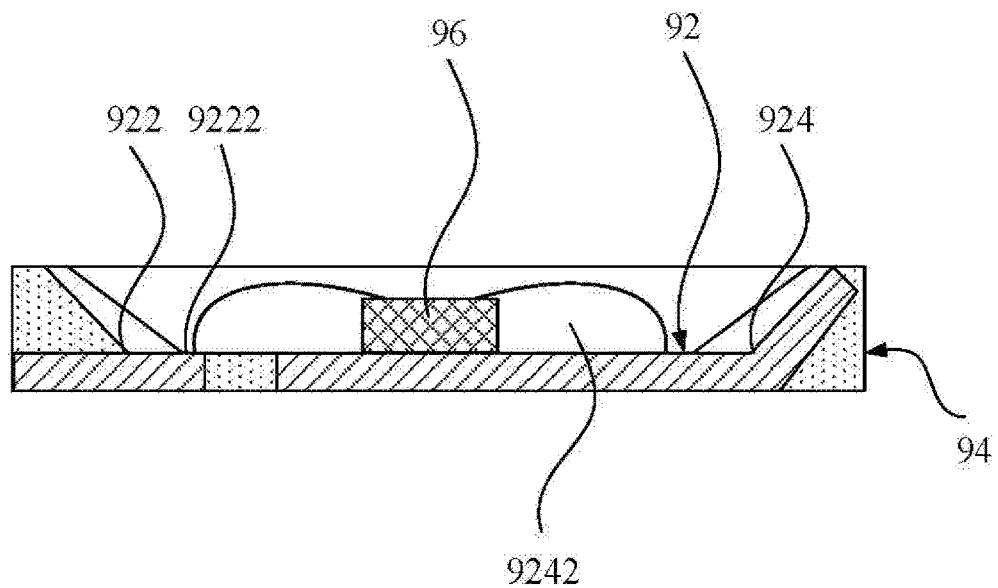
FIG. 28 is a cross-sectional view of a LED module according to an eighth embodiment of the present disclosure.

FIG. 28 is a cross-sectional view showing an LED module of an eighth embodiment of the present disclosure. Referring to FIG. 28, a fifth embodiment of the present disclosure provides an LED module, which includes an insulating carrier 94, a lead frame 92, and an LED chip 96. The LED holder formed by the insulating carrier 94 and the lead frame 92 is similar to the LED holder 100 as described above. The LED chip 96 is electrically coupled to a first bottom portion 9222 of the first electrode 922 and a second bottom portion 9242 of the second electrode 924, respectively.

In summary, the lead frame of the above-mentioned LED holder and the above-mentioned LED module includes the first electrode and the second electrode, and the first wing portion of the first electrode is bent from the first bottom portion toward the first inner side surface of the first sidewall and is located on the first inner side surface, the second wing portion of the second electrode is bent from the second bottom portion toward the second inner side surface of the second sidewall and is located on the second inner side surface; the first wing portion and the second wing portion can shield most of the surface of the insulating carrier, so when it is assembled into the LED module, lights can be prevented from being irradiated to the insulating carrier to deteriorate the insulating carrier, or the problem of the material of the insulating carrier itself is not high reflectivity can be avoided. Therefore, the LED holder can improve the reflectivity of the LED module, and the packaged LED module can be protected from material aging, thereby effectively extending the service life of the LED module product.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A light emitting diode (LED) holder, comprising an insulating carrier and a lead frame fixed with the insulating carrier,
wherein the insulating carrier comprises a first sidewall, a second sidewall and a partition portion, the first sidewall is opposite to the second sidewall, the partition portion is positioned between the first sidewall and the second sidewall, the first sidewall has a sloped first inner side surface, and the second sidewall has a sloped second inner side surface;
wherein the lead frame comprises a first electrode and a second electrode, the first electrode and the second electrode are positioned at two opposite sides of the partition portion and are insulated from each other by the partition portion, the first electrode comprises a first bottom portion and a first wing portion connected to the first bottom portion, the first bottom portion is adjacent to the partition portion of the insulating carrier, the first wing portion extends from the first bottom portion and bends towards the first inner side surface and further locates on the first inner side surface, the second electrode comprises a second bottom portion and a second wing portion connected to the second bottom portion, the second bottom portion is adjacent to the partition portion of the insulating carrier, the second wing portion extends from the second bottom portion and bends towards the second inner side surface and further locates on the second inner side surface;
wherein the first electrode further comprises at least one first branch portion, the first branch portion extends from the first bottom portion towards an end of the first sidewall and penetrates through the first sidewall.

2. The LED holder according to claim 1, wherein the insulating carrier further comprises a third sidewall and a fourth sidewall opposite to the third sidewall, the third sidewall has a sloped third inner side surface, the fourth sidewall has a sloped fourth inner side surface; the first sidewall, the third sidewall, the second sidewall and the fourth sidewall are sequentially connected in that order.

3. The LED holder according to claim 2, wherein the partition portion is connected between the third sidewall and the fourth sidewall; the first electrode further comprises two first secondary wing portions, the two first secondary wing portions extend from the first bottom portion and respectively bend towards the third inner side surface and the fourth inner side surface and further respectively locate on the third inner side surface and the fourth inner side surface; the second electrode further comprises two second secondary wing portions, the two second secondary wing portions extend from the second bottom portion and respectively bend towards the third inner side surface and the fourth inner side surface and further respectively locate on the third inner side surface and the fourth inner side surface.

4. The LED holder according to claim 3, wherein an intersection angle between the first bottom portion and the first secondary wing portions is equal to an intersection angle between the second bottom portion and the second secondary wing portions.

5. The LED holder according to claim 4, wherein the intersection angle between the first bottom portion and the first secondary wing portions is in a range of 93-120 degrees.

6. The LED holder according to claim 2, wherein the partition portion is connected with two opposite sides of the first sidewall, and the partition portion is substantially U-shaped; the second electrode further comprises a third wing portion and a fourth wing portion, the third wing portion extends from the second bottom portion and bends towards the third inner side surface and further locate on the third inner side surface, the fourth wing portion extends from the second bottom portion and bends towards the fourth inner side surface and further locates on the fourth inner side surface.

7. The LED holder according to claim 1, wherein a thickness of the first branch portion is equal to a thickness of the first bottom portion, and the first branch portion is exposed from a bottom surface and a side surface of the first sidewall.

8. The LED holder according to claim 1, wherein a thickness of the first branch portion is less than a thickness of the first bottom portion, and the first branch portion is exposed from a side surface of the first sidewall.

9. The LED holder according to claim 1, wherein the first branch portion is coplanar with the first bottom portion, the first branch portion extends from a corner of the first bottom portion toward a direction away from the first bottom portion, and the first branch portion is partially exposed from the first sidewall.

10. The LED holder according to claim 1, wherein an intersection angle between the first bottom portion and the first wing portion is in a range of 93-120 degrees, and an intersection angle between the second bottom portion and the second wing portion is in a range of 93-120 degrees.

11. The LED holder according to claim 1, wherein the first branch portion extends from a corner of the first bottom portion towards a direction away from the first bottom portion, and the first branch portion is partially exposed from the first sidewall;
wherein the second electrode further comprises at least one second branch portion, the second branch portion extends from a corner of the second bottom portion towards a direction away from the second bottom portion, and the second branch portion is partially exposed from the second sidewall;
wherein the first bottom portion, the second bottom portion, the first branch portion, and the second branch portion are coplanar.

12. A LED holder, comprising an insulating carrier and a lead frame fixed with the insulating carrier,
wherein the insulating carrier comprises a first sidewall, a second sidewall and a partition portion, the first sidewall is opposite to the second sidewall, the partition portion is positioned between the first sidewall and the second sidewall, the first sidewall has a sloped first inner side surface, and the second sidewall has a sloped second inner side surface;
wherein the lead frame comprises a first electrode and a second electrode, the first electrode and the second electrode are positioned at two opposite sides of the partition portion and are insulated from each other by the partition portion, the first electrode comprises a first bottom portion and a first wing portion connected to the first bottom portion, the first bottom portion is adjacent to the partition portion of the insulating carrier, the first wing portion extends from the first bottom portion and bends towards the first inner side surface and further locates on the first inner side surface, the second electrode comprises a second bottom portion and a second wing portion connected to the second bottom portion, the second bottom portion is adjacent to the partition portion of the insulating carrier, the second wing portion extends from the second bottom portion and bends towards the second inner side surface and further locates on the second inner side surface;
wherein the insulating carrier further comprises a third sidewall and a fourth sidewall opposite to the third sidewall, the third sidewall has a sloped third inner side surface, the fourth sidewall has a sloped fourth inner side surface; the first sidewall, the third sidewall, the second sidewall and the fourth sidewall are sequentially connected in that order; and
wherein the partition portion is connected between the third sidewall and the fourth sidewall; the first electrode further comprises two first secondary wing portions, the two first secondary wing portions extend from the first bottom portion and respectively bend towards the third inner side surface and the fourth inner side surface and further respectively locate on the third inner side surface and the fourth inner side surface; the second electrode further comprises two second secondary wing portions, the two second secondary wing portions extend from the second bottom portion and respectively bend towards the third inner side surface and the fourth inner side surface and further respectively locate on the third inner side surface and the fourth inner side surface.

13. The LED holder according to claim 12, wherein an intersection angle between the first bottom portion and the first secondary wing portions is equal to an intersection angle between the second bottom portion and the second secondary wing portions.

14. The LED holder according to claim 13, wherein the intersection angle between the first bottom portion and the first secondary wing portions is in a range of 93-120 degrees.

15. A LED module, comprising an insulating carrier, a lead frame and a LED chip, and the lead frame is fixed with the insulating carrier;
wherein the insulating carrier comprises a first sidewall, a second sidewall and a partition portion, the first sidewall is opposite to the second sidewall, the partition portion is positioned between the first sidewall and the second sidewall, the first sidewall has a sloped first inner side surface, and the second sidewall has a sloped second inner side surface;
wherein the lead frame comprises a first electrode and a second electrode, the first electrode and the second electrode are positioned at two opposite sides of the partition portion and are insulated from each other by the partition portion, the first electrode comprises a first bottom portion and a first wing portion connected to the first bottom portion, the first bottom portion is adjacent to the partition portion of the insulating carrier, the first wing portion extends from the first bottom portion and bends towards the first inner side surface and further locates on the first inner side surface; the second electrode comprises a second bottom portion and a second wing portion connected to the second bottom portion, the second bottom portion is adjacent to the partition portion of the insulating carrier, the second wing portion extends from the second bottom portion and bends towards the second inner side surface and further locates on the second inner side surface;
wherein the first electrode further comprises at least one first branch portion, the first branch portion extends from the first bottom portion towards an end of the first sidewall and penetrates through the first sidewall;
wherein the LED chip is electrically coupled to the first bottom portion and the second bottom portion.

* * * * *